April 13, 1965 R. C. OELER ETAL 3,177,561

METHOD OF ASSEMBLING COMPONENTS ON A CHASSIS

Filed July 16, 1962

INVENTOR.
Richard C. Oeler
BY Edward A. Salners
Mueller & Aichele
Attys.

3,177,561

METHOD OF ASSEMBLING COMPONENTS ON A CHASSIS

Richard C. Oeler, Elmhurst, and Edward A. Salners, Mount Prospect, Ill., assignors to Motorola, Inc., Chicago, Ill., a corporation of Illinois Filed July 16, 1962, Ser. No. 210,056
7 Claims. (Cl. 29—155.5)

This invention relates to a method for mounting electrical components on a chassis, and more particularly to such a method which permits a plurality of closely spaced electrical components to be secured to a chassis in a single operation.

Many electrical devices incorporate a plurality of interconnected electrical components such as tube sockets and terminal strips fixed to a common chassis. By ordinary methods these components are secured to the chassis with rivets which extend through the chassis and through a flat wafer portion on the component. When there are a number of components to be mounted in a relatively small area, as is often the case, automatic riveting is virtually impossible. This is because the crowded placement of components and lack of space hinders access to the components by the riveting apparatus. In addition, the riveting of numerous components to a single chassis requires a correspondingly large number of separate riveting operations and machine setups. Furthermore, the operator would have to reposition the chassis for each of the components to be riveted.

It is possible to assemble a number of components to a chassis at one time by using integral eyelets. This method, however, is more costly.

Accordingly, an object of this invention is to provide an improved method for securing electrical components to a chassis.

Another object of the invention is to provide a semi-automated method for securing a plurality of different kinds of electrical components to a chassis.

A still further object of the invention is to provide a method for securing a plurality of different electrical components to a chassis, wherein all the components are secured thereto in a single operation.

A feature of the invention is the provision, in a method for securing electrical components to a chassis, of the step of perforating the chassis to form a plurality of openings and a plurality of upwardly extending lances in predetermined position prior to mounting the components thereto.

Still another feature of the invention is the provision, in a method for securing electrical components to a chassis, of the step of placing a plurality of components on the above described perforated chassis with the chassis placed upon a lower die having locating pins extending through the openings in the chassis and through rivet holes on the components.

Another feature of the invention is the provision, in a method for securing electrical components to a chassis, of the step of staking the components to the chassis by providing an upper die having a plurality of staking pins aligned with lances on the chassis. The upper die is brought toward the chassis to permit the staking pins to strike respective ones of the lances to press them toward the chassis and secure the components thereto.

Another feature of the invention is the provision, in a method for staking a plurality of electrical components to a lanced chassis by means of die operated staking pins, of the step of pressing the components against the chassis by means of a plurality of resiliently retractable pressure pads which engage the components just prior to the staking pins engaging the lances, to insure accurate placement.

Briefly, the invention comprises a method of mounting or staking a plurality of electronic components to a chassis, which components have a flange-like or wafer-type mounting portion with rivet holes therein. The chassis is first perforated to form a plurality of openings in predetermined positions and to form a plurality of tabs or lances extending upwardly from the surface thereof in predetermined positions. The chassis is next placed on a lower die member having a plurality of locating pins which extend upwardly therefrom and through openings in the chassis. Next, each of the plurality of components is placed in a predetermined position on the chassis adjacent certain lances and with the locating pins extending through the rivet holes in the component to locate the same. An upper die is provided with a plurality of spring biased pressure pads and a plurality of staking pins. The pressure pads are positioned on the upper die in alignment with selected areas of the mounting portions of the electrical components. The staking pins are aligned with the respective lances. As the upper die is brought down toward the chassis, the pressure pads first strike the components pressing them against the surface of the chassis to secure them in position. Then the staking pins strike the lances bending them toward the chassis to secure the components thereto.

Referring now to the drawings, FIG. 1 is an exploded view of apparatus in which the method of the invention may be used;

Figures 1, 2, 3, 4, 5, 6:
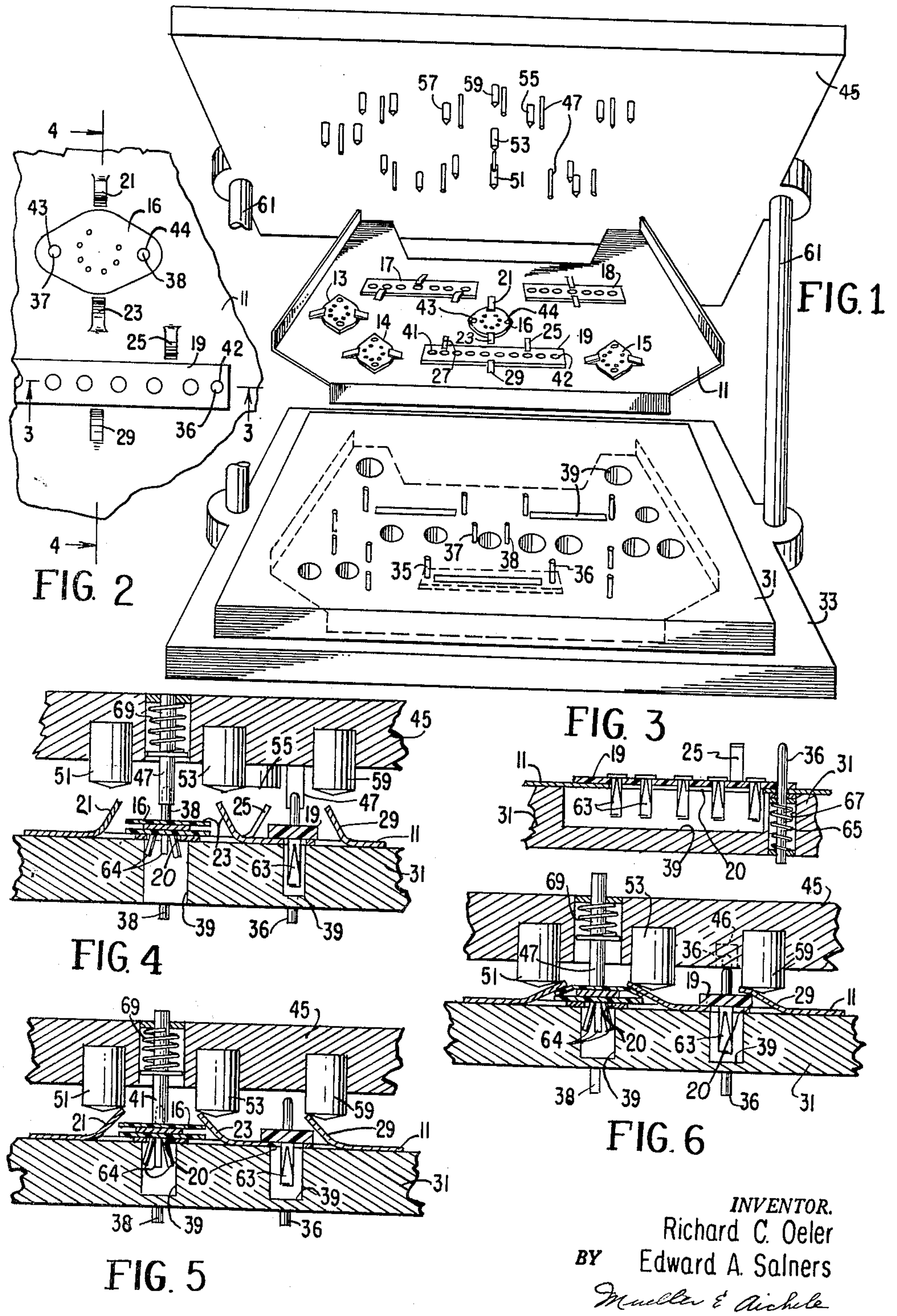
FIG. 2 is a broken away section of the chassis shown in FIG. 1 as it appears in place on the lower die.
FIG. 3 is a section view taken along the line 3—3 of FIG. 2.
FIG. 4 is a cross-sectional view taken along the line 4—4 of FIG. 2 showing, in addition, the upper die and associated elements.
FIG. 5 is similar to FIG. 4 with the upper die moved closer to the chassis.
FIG. 6 is a cross-sectional view similar to FIG. 5 with the upper die moved still closer to the chassis.

Referring now to FIG. 1, there is shown a chassis member 11 having a plurality of components thereon, such as tube sockets 13, 14, 15 and 16, and terminal strips 17, 18 and 19. These various components are secured to the chassis by means of integral tabs or lances, for example, 21, 23, 25, 27 and 29. A plurality of openings 20 (FIGS. 3–6) are also formed in chassis 11 to permit portions of the components to protrude therethrough. A lower die 31 is mounted on platform 33 and contains a plurality of locating pins, for example, 35, 36, 37 and 38. Openings 20 in chassis 11 also permit the locating pins to extend therethrough. A plurality of slots and openings 39 of varying shapes and sizes are formed in lower die 31 to accommodate any protrusions of electrical components from the mating surface of chassis 11. This permits chassis 11 to lie flush against the surface of lower die 31 with the locating pins extending through openings 20 in chassis 11 and through the rivet holes in the various components. Thus, for example, pins 35, 36, 37 and 38 would extend through rivet holes 41, 42, 43 and 44 respectively.

An upper die 45 contains a plurality of pressure pads 47 extending downwardly therefrom, and further contains a plurality of staking pins, for example, 51, 53, 55, 57 and 59. The staking pins are aligned with respective lances on the chassis, with the said exemplary pins being aligned with lances 21, 23, 25, 27 and 29 respectively. The upper die is mounted to be moved toward the lower die on guide rods 61.

FIG. 2 depicts a broken away section as indicated in

FIG. 1 of chassis 11 along with the components mounted thereon, as this section would appear when placed upon lower die 31. The respective lances 21, 23, 25 and 29 are not bent over to secure the components to the chassis surface as was the case in FIG. 1

Referring now to FIG. 3, a cross-sectional view of the appearance of terminal strip 19, as placed on the chassis 11 with the chassis against the lower die 31, is shown. Terminal strip 19 contains a plurality of lug members 63 which extend downwardly therefrom through opening 20 in chassis 11, and are accommodated by one of the openings 39 in the lower die. Leads may be inserted into these members 63, and then the lug members may be dip soldered for sure connection. The locating pins may be resiliently mounted in the lower die, shown for example as locating pin 36 biased upwardly by spring 65 in mounting cavity 67 in lower die 31. This is done to enable the locating pins to retract if struck by the upper die 45. Alternatively, the pins may be rigidly mounted and openings to accommodate the pins can be formed in the upper die. This is illustrated in dotted lines in FIG. 6 showing opening 46 in upper die 45.

Referring now to FIG. 4, tube socket 16 and terminal strip 19 are shown as they are positioned on chassis 11 before staking. To attain this positioning, the following steps are performed. Chassis 11 is perforated to form openings 20 therein and also to form the lances for securing the various elements. Chassis 11, when perforated, is placed upon lower die 31 with the locating pins extending through the openings 20 in chassis 11. The various components are then placed upon chassis 11 with the locating pins extending through the rivet holes in the components. This may be seen clearly from FIG. 4. Note how lug members 63 and solder lugs 64 protrude through opening 20 in the chassis and into openings 39 in the lower die.

The upper die 45 is then moved toward chassis 11 on lower die 31 and the staking operation takes place. The pressure pads, which are lined up with appropriate portions of the components to hold them securely against the chassis, strike the components and press them against the chassis. The pressure pads are designed, as may be seen from FIGS. 4, 5 and 6, with biasing springs 69 to permit each pressure pad to retract upon striking the components as the upper die moves closer to the chassis.

The staking pins then strike the lances with which they are aligned as may be seen in FIG. 5. Further movement of upper die 45 causes the staking pins to bend the associated lances until, as shown in FIG. 6, the components are securely held against the surface of the chassis. The upper die may then be raised and the chassis removed with the components staked securely in place as shown in FIG. 1.

With lance material of low yield point and sufficiently long length, excellent takeup is attained for the many variations in thickness of components, resulting in secure damage free staking for all components regardless of size. This "takeup" occurs when a lance has effectively secured a relatively thick component to the chassis but the upper die continues to move down to insure staking of the thinner components. Under these circumstances the lance will not only bend where it joins the chassis, but will also bend where it engages the component, as does tab 29 in FIG. 6. This insures that the components will not be damaged by the application of forces beyond their strength under compression. This method provides lower material cost, less assembly labor, less handling, and fewer machines, and yet still permits easy repair or replacement. This latter attribute exists because although the components are staked by lances to the surface of the chassis, the rivet holes are still used for locating, and in the event a component requires replacement, these rivet holes may be used to secure the replacement component to the chassis by means of rivets. The extra cost of rivets or integral eyelets in the original assembly is eliminated, and furthermore, in one stroke of a press all tabs or lances are set to secure the components to the chassis.

Accordingly, the invention provides an improved method for securing electrical components to a chassis, wherein a plurality of electrical components are secured to the chassis in a single semi-automated operation.

We claim:

1. A method of staking a plurality of electronic components to a chassis, said components having mounting portions, said method including the following steps, perforating said chassis to form a plurality of straight lances extending upwardly from the surface thereof in predetermined positions with their ends spaced to permit said components to pass linearly therebetween, passing said components linearly between said lances to predetermined positions on said chassis adjacent selected ones of said lances, aligning a plurality of staking pins with said plurality of lances on said chassis, and simultaneously moving said staking pins to engage said lances proximate the ends thereof and bend said lances toward said chassis, said lances engaging respective corners of said components and further bending at the point of their engagement with said components, thereby to secure said components in place between said lances and said chassis.

2. A method of staking a plurality of electronic components to a chassis, said components having respective mounting portions of different thickness, said method including the following steps, perforating said chassis to form a plurality of straight lances extending upwardly from the surface thereof in predetermined positions with their ends spaced to permit said components to pass linearly therebetween passing said components linearly between said lances to predetermined positions on said chassis adjacent selected ones of said lances, providing an upper die member having a plurality of staking pins aligned with said plurality of lances on said chassis, and moving said upper die toward a lower die a given distance to permit said staking pins to engage said lances proximate the ends thereof and bend the same towards said chassis, said lances engaging respective corners of said components and further bending at the point of their engagement with said components to absorb the differences in thickness between said mounting portions of said components and prevent damage thereto, thereby to secure said components in place between said lances and said chassis.

3. A method of staking a plurality of electronic components to a chassis, said components having mounting portions, said method including the following steps, perforating said chassis to form a plurality of lances extending upwardly from the surface thereof in predetermined positions, placing said components in predetermined positions on said chassis adjacent selected ones of said lances, providing an upper die member having a plurality of staking pins aligned with said plurality of lances on said chassis and further having a plurality of resiliently retractable pressure pads aligned with portions of said components, and moving said upper die toward a lower die to permit said pressure pads to strike said components and press the same against said chassis and, as said pressure pads retract against the resiliency thereof, to cause said staking pins to engage said lances and bend the same towards said chassis, thereby to secure said components in place between said lances and said chassis.

4. A method of staking a plurality of electronic components to a chassis, said components having mounting portions with rivet holes therein, said method including the following steps, perforating said chassis to form a plurality of openings therein in predetermined positions and to form a plurality of lances extending upwardly from the surface thereof in predetermined positions, providing a lower die member having a plurality of locating pins extending upwardly therefrom in predetermined positions, placing said chassis on said lower die member with said locating pins extending through said openings in said chassis, placing said components on said chassis adjacent selected one of said lances and with said locating pins extending through said openings in said chassis and said rivet holes in said components to locate said components in predetermined positions, aligning a plurality of staking pins with said plurality of lances on said chassis, and simultaneously moving said staking pins to engage said lances and bend the same toward said chassis, thereby to secure said components in place between said lances and said chassis.

5. A method of staking a plurality of electronic components to a chassis, said components having mounting portions with rivet holes therein, said method including the following steps, perforating said chassis to form a plurality of openings therein in predetermined positions and to form a plurality of lances extending upwardly from the surface thereof in predetermined positions, providing a lower die member having a plurality of locating pins extending upwardly therefrom in predetermined positions, placing said chassis on said lower die member with said locating pins extending through said openings in said chassis, placing said components in predetermined positions on said chassis adjacent selected ones of said lances and with said locating pins extending through said openings in said chassis and said rivet holes in said components, providing an upper die member having a plurality of resiliently retractable pressure pads aligned with predetermined portions of said components for steadying the same during staking and further having a plurality of staking pins aligned with said plurality of lances on said chassis, and moving said upper die toward said lower die to cause said pressure pads to engage said components to press the same against said chassis and, as said pressure pads retract against the resiliency thereof, to cause said staking pins to engage said lances and bend the same towards said chassis and secure said components in place between said lances and said chassis.

6. A method of staking a plurality of electronic components to a chassis, said components having mounting portions of varying thickness with rivet holes therein, said method including the following steps; perforating said chassis to form a plurality of openings therein in predetermined positions and to form a plurality of integral lances extending upwardly from the surface thereof in predetermined positions, providing a lower die member having a plurality of resiliently retractable locating pins extending upwardly therefrom in predetermined positions and a plurality of openings therein to accommodate projecting portions of components on said chassis, placing said chassis on said lower die member with said locating pins extending through said openings in said chassis, placing said components in predetermined positions on said chassis adjacent selected ones of said lances and with said locating pins extending through said rivet holes in said components, providing an upper die member having a plurality of resiliently retractable pressure pads aligned with predetermined portions of said components for steadying the same during staking and having a plurality of openings formed therein aligned with said locating pins on said lower die to accommodate said locating pins, and further having a plurality of staking pins aligned with said plurality of lances on said chassis, and moving said upper die toward said lower die to cause said pressure pads to engage said components to press the same against said chassis and, as said pressure pads retract againt the resiliency thereof, to cause said staking pins to engage said lances and bend the same towards said chassis and secure said components in place between said lances and said chassis.

7. A method of staking a plurality of electronic components to a chassis, said components having mounting portions of varying thickness with rivet holes therein, said method including the following steps; perforating said chassis to form a plurality of openings therein in predetermined positions and to form a plurality of integral lances extending upwardly from the surface thereof in predetermined positions, providing a lower die member having a plurality of resiliently retractable locating pins extending upwardly therefrom in predetermined positions and a plurality of openings therein to accommodate projecting portions of components on said chassis, placing said chassis on said lower die member with said locating pins extending through said openings in said chassis, placing said components in predetermined positions on said chassis adjacent selected ones of said lances and with said locating pins extending through said rivet holes in said components, providing an upper die member having a plurality of resiliently retractable pressure pads aligned with predetermined portions of said components for steadying the same during staking, and further having a plurality of staking pins aligned with said plurality of lances on said chassis, and moving said upper die toward said lower die to cause said pressure pads to engage said components to press the same against said chassis and, as said pressure pads retract against the resiliency thereof, to cause said staking pins to engage said lances and bend the same towards said chassis and secure said components in place between said lances and said chassis.

References Cited by the Examiner

UNITED STATES PATENTS

| | | | | |
|---|---|---|---|---|
| 2,352,126 | 6/44 | Schmitt | 339—131 | X |
| 2,604,258 | 7/52 | Murnane et al. | 29—511 | X |
| 2,666,253 | 1/54 | Morberg | 113—1 | X |
| 2,680,840 | 6/54 | O'Neill | 339—131 | X |
| 2,800,374 | 7/57 | Ernst | 29—513 | X |
| 2,837,593 | 6/58 | Rueger. | | |

WHITMORE A. WILTZ, *Primary Examiner.*